(12) United States Patent
Sakurai et al.

(10) Patent No.: US 8,665,020 B2
(45) Date of Patent: Mar. 4, 2014

(54) DIFFERENTIAL AMPLIFIER CIRCUIT THAT CAN CHANGE CURRENT FLOWING THROUGH A CONSTANT-CURRENT SOURCE ACCORDING TO LOAD VARIATION, AND SERIES REGULATOR INCLUDING THE SAME

(75) Inventors: Kohei Sakurai, Tama (JP); Akihiro Terada, Tama (JP); Yoichi Takano, Tama (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 191 days.

(21) Appl. No.: 13/175,512

(22) Filed: Jul. 1, 2011

(65) Prior Publication Data

US 2012/0001605 A1    Jan. 5, 2012

(30) Foreign Application Priority Data

Jul. 5, 2010    (JP) ................ 2010-152568

(51) Int. Cl.
*H03F 3/45*    (2006.01)
*H03F 3/30*    (2006.01)

(52) U.S. Cl.
USPC ........................... 330/255; 330/257; 330/300

(58) Field of Classification Search
USPC ......................................... 330/255, 257, 300
See application file for complete search history.

(56) References Cited

U.S. PATENT DOCUMENTS

| | | | |
|---|---|---|---|
| 5,399,992 A | | 3/1995 | Itakura et al. |
| 5,510,754 A | * | 4/1996 | Moraveji et al. ............... 330/267 |
| 6,437,645 B1 | * | 8/2002 | Ivanov et al. .................. 330/255 |
| 7,514,877 B2 | | 4/2009 | Nakayama |
| 7,560,988 B2 | * | 7/2009 | Weng et al. .................... 330/260 |
| 7,768,351 B2 | * | 8/2010 | Ivanov et al. .................. 330/255 |
| 8,289,302 B2 | * | 10/2012 | Chen et al. ..................... 345/204 |

FOREIGN PATENT DOCUMENTS

| | | |
|---|---|---|
| JP | 04-356816 A | 12/1992 |
| JP | 05-129844 A | 5/1993 |
| JP | 2002-268760 A | 9/2002 |
| JP | 2004-240646 A | 8/2004 |
| JP | 2008-005144 A | 1/2008 |
| JP | 2009-302781 A | 12/2009 |

OTHER PUBLICATIONS

Chinese Office Action dated Jul. 30, 2013 (and English translation thereof) in counterpart Chinese Application No. 201110191028.4.
Japanese Office Action dated Dec. 3, 2013 (and English translation thereof) in counterpart Japanese Application No. 2010-152568.

* cited by examiner

*Primary Examiner* — Bao Q Vu
(74) *Attorney, Agent, or Firm* — Holtz, Holtz, Goodman & Chick, PC

(57) ABSTRACT

A differential amplifier circuit including: a differential input stage including a pair of differential MOS transistors, a pair of load elements, and a first constant-current source; an output stage including an output MOS transistor and a second constant-current source; a constant-current MOS transistor provided in parallel to one of the first and second constant-current sources; and a boost current controlling MOS transistor in which a potential of a connection node of the output MOS transistor and the second constant-current source is applied to a gate terminal thereof; wherein the boost current controlling MOS transistor is turned on when a voltage inputted to a gate terminal of one of the pair of differential MOS transistors changes, and a current of the constant-current MOS transistor is added to one of the first and second constant-current sources and is allowed to flow.

14 Claims, 4 Drawing Sheets

DIFFERENTIAL AMPLIFIER CIRCUIT THAT CAN CHANGE CURRENT FLOWING THROUGH A CONSTANT-CURRENT SOURCE ACCORDING TO LOAD VARIATION, AND SERIES REGULATOR INCLUDING THE SAME

BACKGROUND OF THE INVENTION

1. Field of the Invention

The present invention relates to a differential amplifier circuit whose transient response characteristic is improved, and particularly to a voltage controlling differential amplifier circuit constituting a direct-current (DC) power supply device such as a series regulator, and a technique which is effectively applied to the series regulator which uses the differential amplifier circuit.

2. Description of Related Art

A series regulator that outputs a constant DC voltage by controlling a resistance value of a control transistor connected between a voltage input terminal and a voltage output terminal is in widespread use as a DC power supply device. In the series regulator, a differential amplifier circuit illustrated in FIG. 4 is used as a circuit that generates a voltage applied to a control terminal (a gate terminal or a base terminal) of the control transistor according to a feedback voltage. A differential amplifier circuit 10 illustrated in FIG. 4 includes a differential input stage 11 and an output stage 12. The differential input stage 11 includes a pair of differential metal-oxide semiconductor (MOS) transistors (insulated gate field effect transistors) Mp1 and Mp2 whose sources are commonly connected, load MOS transistors Mn1 and Mn2 that are connected to drains of the differential MOS transistors Mp1 and Mp2, respectively, and a constant-current MOS transistor Mp0 that is connected between the common source of the differential MOS transistors Mp1 and Mp2 and a power supply voltage VDD. The differential input stage 11 is configured as a complementary metal-oxide semiconductor (CMOS) differential amplifier circuit.

The output stage 12 includes a constant-current MOS transistor Mp3 and a MOS transistor Mn3. The gate of the constant-current MOS transistor Mp3 and the gate of the constant-current MOS transistor Mp0 of the differential input stage 11 are commonly connected. The MOS transistor Mn3 is connected in series to the constant-current MOS transistor Mp3 between the power supply voltage VDD and a ground point. The output stage 12 is configured such that the drain of the differential MOS transistor Mp2 of the differential input stage 11 is connected to a gate terminal of the MOS transistor Mn3 and such that a control MOS transistor Mp4 composed of a power MOS transistor is controlled by a voltage at a connection node N1 of the constant-current MOS transistor Mp3 and the MOS transistor Mn3.

A common bias voltage Vb is applied to the gate terminals of the constant-current MOS transistors Mp0 and Mp3, and identical or proportional constant currents are allowed to flow through the constant-current MOS transistors Mp0 and Mp3. A reference voltage Vr is applied to the gate terminal of the differential MOS transistor Mp1 on a non-inverting input side of the differential input stage 11, and a voltage that is divided by voltage dividing resistors R1 and R2 which are connected in series between an output terminal OUT and the ground point is applied as a feedback voltage FB to the gate terminal of the differential MOS transistor Mp2. Thereby, the differential amplifier circuit 10 controls the control MOS transistor Mp4 such that the feedback voltage FB and the reference voltage Vr match with each other.

In the series regulator illustrated in FIG. 4, it is not going to matter much when a load connected to the output terminal OUT is light. However, when a heavy load is connected, the degraded transient response characteristic of the differential amplifier circuit cannot keep the output voltage constant. On the other hand, the transient response characteristic of the differential amplifier circuit illustrated in FIG. 4 depends on currents flowing through the constant-current MOS transistors Mp0 and Mp3 of the differential input stage 11 and the output stage 12, and the transient response characteristic improves with increasing currents flowing through the constant-current MOS transistors Mp0 and Mp3.

Therefore, the voltage controlling differential amplifier circuit of the series regulator is conventionally designed such that the currents flowing through the constant-current MOS transistors Mp0 and Mp3 are increased when the series regulator is used in a heavy-load system. However, when the series regulator is used in the light-load system, unfortunately a consumption current of the differential amplifier circuit is unnecessarily increased which causes degradation of power efficiency.

To solve this problem, Japanese Patent Application Laid-Open No. 2004-240646, for example, discloses a technique of providing a bias current varying circuit that changes a current flowing through a constant-current source according to a load variation. However, the bias current varying circuit disclosed in Japanese Patent Application Laid-Open No. 2004-240646 has a problem in that the power efficiency is decreased. That is because nearly 10 elements are used, and thereby a circuit occupies a large area and the consumption current of the bias current varying circuit flows as a wasted current.

SUMMARY OF THE INVENTION

An object of the invention is to provide a voltage controlling differential amplifier circuit of a series regulator that can change the current flowing through the constant-current source according to the load variation to enhance the transient response characteristic without increasing the unnecessary current or largely increasing the circuit scale.

According to a first aspect of the present invention, there is provided a differential amplifier circuit including: a differential input stage including a pair of differential MOS transistors whose sources are commonly connected, a pair of load elements that are connected to drain terminals of the differential MOS transistors, respectively, and a first constant-current source that is connected to the common source of the pair of differential MOS transistors; an output stage including an output MOS transistor whose gate terminal receives a potential of an output node of the differential input stage, and a second constant-current source that is connected in series to the output MOS transistor; a constant-current MOS transistor that is provided in parallel to one of the first constant-current source and the second constant-current source; and a boost current controlling MOS transistor in which a potential of a connection node of the output MOS transistor and the second constant-current source is applied to a gate terminal thereof; wherein the boost current controlling MOS transistor is turned on when a voltage inputted to a gate terminal of one of the pair of differential MOS transistors changes, and a current of the constant-current MOS transistor is added to one of the first constant-current source and the second constant-current source and is allowed to flow through one of the differential input stage and the output stage.

According to a second aspect of the present invention, there is provided a differential amplifier circuit including: a differential input stage including a pair of differential MOS transistors whose sources are commonly connected, a pair of load elements that are connected to drain terminals of the differential MOS transistors, respectively, and a first constant-current source that is connected to the common source of the pair of differential MOS transistors; an output stage including an output MOS transistor whose gate terminal receives a potential of an output node of the differential input stage, and a second constant-current source that is connected in series to the output MOS transistor; a first constant-current MOS transistor that is provided in parallel to the first constant-current source; a second constant-current MOS transistor that is provided in parallel to the second constant-current source; and a boost current controlling MOS transistor in which a potential of a connection node of the output MOS transistor and the second constant-current source is applied to a gate terminal thereof; wherein the boost current controlling MOS transistor is turned on when a voltage inputted to a gate terminal of one of the pair of differential MOS transistors changes, and currents of the first constant-current MOS transistor and the second constant-current MOS transistor are added to the first constant-current source and the second constant-current source, respectively, and are allowed to flow through the differential input stage and the output stage.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein.

DESCRIPTION OF THE PREFERRED EMBODIMENTS

Figure 1:
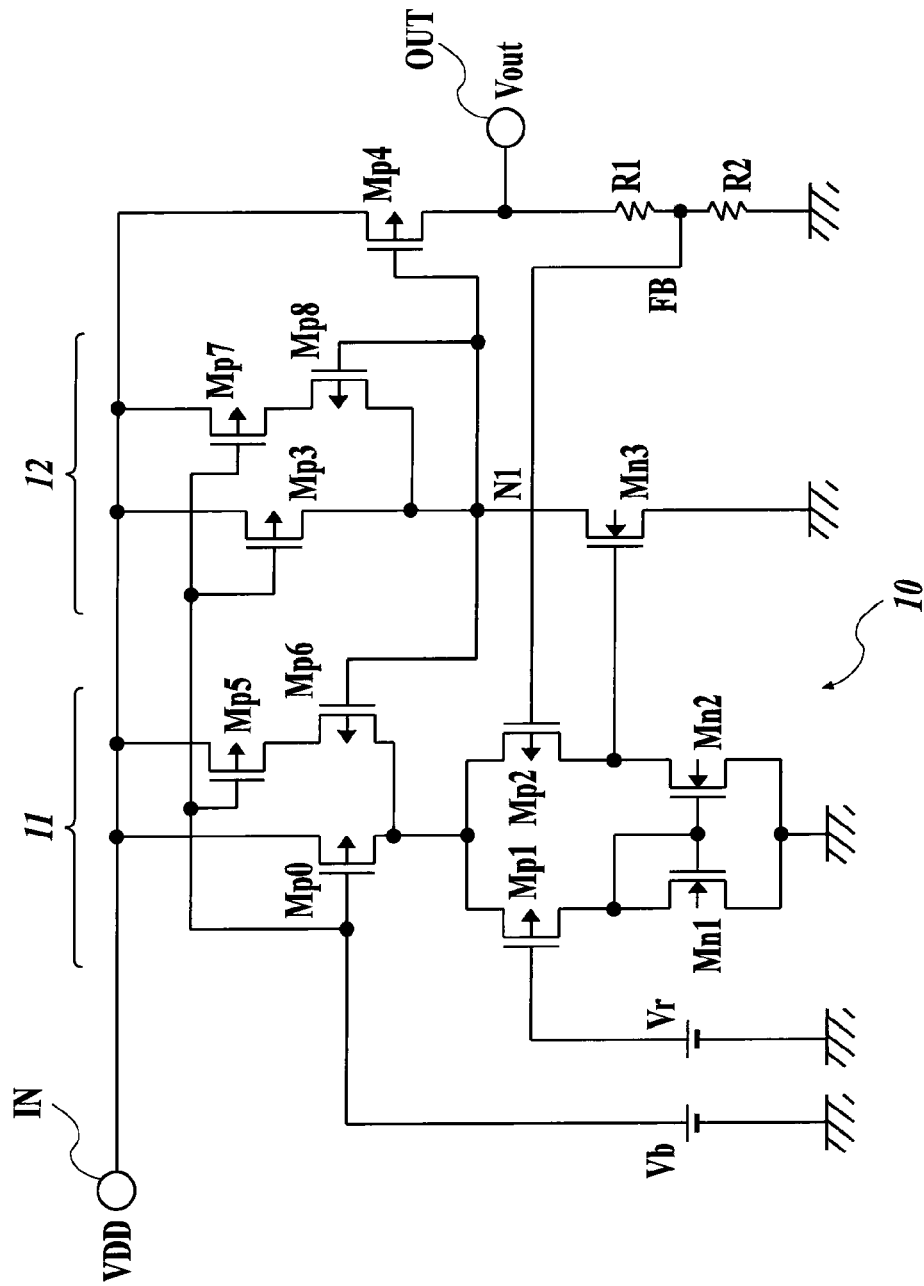
FIG. 1 is a circuit diagram illustrating a voltage controlling differential amplifier circuit and a series regulator which uses the voltage controlling differential amplifier circuit according to a first embodiment of the present invention.

Hereinafter, preferred embodiments of the present invention are described below with reference to the drawings.
(First Embodiment)
FIG. 1 is a circuit diagram illustrating a voltage controlling differential amplifier circuit and a series regulator which uses the voltage controlling differential amplifier circuit according to a first embodiment of the present invention.

A CMOS differential amplifier circuit of the first embodiment includes a differential input stage 11 and an output stage 12. The differential input stage 11 includes a pair of differential MOS transistors (insulated gate field effect transistors) Mp1 and Mp2 whose sources are commonly connected, active load MOS transistors Mn1 and Mn2 (load elements) that are connected to drains of the differential MOS transistors Mp1 and Mp2, respectively, and a constant-current MOS transistor Mp0 (first constant-current source) that is connected between the common source of the differential MOS transistors Mp1 and Mp2 and a power supply voltage VDD. The differential input stage 11 is configured as a CMOS differential amplifier circuit. The active load MOS transistors Mn1 and Mn2 constitute a current mirror circuit with the gates of the active load MOS transistors Mn1 and Mn2 commonly connected. A resistor may be used instead of the active load MOS transistors Mn1 and Mn2. In the first embodiment, a MOS transistor in which an outward arrow is attached to an element symbol thereof is a P-channel MOS transistor, and a MOS transistor in which an inward arrow is attached to an element symbol thereof is an N-channel MOS transistor.

The output stage 12 includes a constant-current MOS transistor Mp3 (second constant-current source) and a MOS transistor Mn3 (output MOS transistor). The gate of the constant-current MOS transistor Mp3 and gate of the constant-current MOS transistor Mp0 of the differential input stage 11 are commonly connected. The MOS transistor Mn3 is connected in series to the constant-current MOS transistor Mp3 between the power supply voltage VDD and a ground point. The output stage 12 is configured such that the drain of the differential MOS transistor Mp2 of the differential input stage 11 is connected to a gate terminal of the MOS transistor Mn3 and such that a control MOS transistor Mp4 composed of a power MOS transistor is controlled by a voltage at a connection node N1 of the constant-current MOS transistor Mp3 and the MOS transistor Mn3.

A common bias voltage Vb is applied to the gate terminals of the constant-current MOS transistors Mp0 and Mp3, and the constant-current MOS transistors Mp0 and Mp3 flow identical or proportional constant currents. A reference voltage Vr is applied to the gate terminal of the differential MOS transistor Mp1 on a non-inverting input side of the differential input stage 11, and a voltage that is divided by voltage dividing resistors R1 and R2 connected in series between an output terminal OUT and the ground point is applied as a feedback voltage FB to the gate terminal of the differential MOS transistor Mp2. Therefore, the differential amplifier circuit 10 controls the control MOS transistor Mp4 such that the feedback voltage FB and the reference voltage Vr match with each other. A bias circuit that generates the bias voltage Vb may be composed of a current-voltage conversion MOS transistor in which the gate and drain are coupled and a constant-current source that is connected in series to the current-voltage conversion MOS transistor. The current-voltage conversion MOS transistor and the constant-current MOS transistors Mp0 and Mp3 of FIG. 1 are connected in a current mirror manner, which allows the constant currents to flow through the constant-current MOS transistors Mp0 and Mp3.

In the differential amplifier circuit 10 of the first embodiment, a MOS transistor Mp5 (first constant-current MOS transistor) and a MOS transistor Mp6 (first boost current controlling MOS transistor) are connected between the power supply voltage VDD and the drain terminal of the constant-current MOS transistor Mp0. The bias voltage Vb identical to that of the constant-current MOS transistor Mp0 is applied to the gate terminal of the MOS transistor Mp5. The MOS transistor Mp6 is connected in series to the MOS transistors Mp5. In the output stage 12, similarly a MOS transistor Mp7 (second constant-current MOS transistor) and a MOS transistor Mp8 (second boost current controlling MOS transistor) are connected between the power supply voltage VDD and the drain terminal of the constant-current MOS transistor Mp3. The bias voltage Vb identical to that of the constant-current MOS transistor Mp3 is applied to the gate terminal of the MOS transistor Mp7. The MOS transistor Mp8 is connected in series to the MOS transistors Mp7. The voltage at the connection node N1 of the MOS transistors Mp3 and Mn3 of the output stage 12 is applied to the gate terminals of the MOS transistors Mp6 and Mp8. The voltage at the connection node N1 is also applied to the gate terminal of the control MOS transistor Mp4.

Next, an operation of the differential amplifier circuit 10 of the first embodiment in FIG. 1 is described below. In a steady state of the differential amplifier circuit 10 in FIG. 1, even if the constant-current MOS transistors Mp0 and Mp3 and the control MOS transistors Mp4 are turned on, the MOS transistors Mp6 and Mp8 are in an off-state because the MOS transistors Mp5 and Mp6, and the MOS transistor Mp7 and Mp8, which are parallel to the constant-current MOS transistors Mp0 and Mp3, are a double stack structure of P-channel MOS transistors. In this state, when the load connected to the output terminal OUT is rapidly increased, an output voltage Vout falls to decrease the feedback voltage FB divided by the resistors R1 and R2. Then, feedback control is performed in the following way; the drain voltage at the differential MOS transistor Mp2 whose gate terminal receives the feedback voltage rises, and thereby, the current of the MOS transistor Mn3 of the output stage 12 is increased. Then, the voltage at the connection node N1 of the MOS transistors Mp3 and Mn3 falls and thereby the current of the control MOS transistor Mp4 is increased.

In the differential amplifier circuit 10 of the first embodiment, when the load becomes rapidly heavy and thereby the voltage at the connection node N1 of the MOS transistors Mp3 and Mn3 is decreased, the MOS transistors Mp6 and Mp8 (boost current controlling MOS transistors) are turned on, and currents are allowed to flow through the MOS transistors Mp5 and Mp7 (constant-current MOS transistors) in each of which the bias voltage Vb identical to that of the constant-current MOS transistors Mp0 and Mp3 is applied to the gate terminal thereof, thereby increasing the currents of the differential input stage 11 and the output stage 12. As a result, the transient response characteristic of the differential amplifier circuit 10 is improved and the output voltage Vout can be quickly stabilized to a desired voltage $(R1+R2)/Vr \cdot R2$. Hereinafter the current added by the MOS transistors Mp6 and Mp8 is referred to as a boost current. On the other hand, when the load becomes light and the current flowing through the load from the output terminal OUT is decreased, the voltage at the connection node N1 rises and the MOS transistors Mp6 and Mp8 are turned off, and the boost current does not flow, thereby returning to a low consumption current state.

(Second Embodiment)

Figure 2:
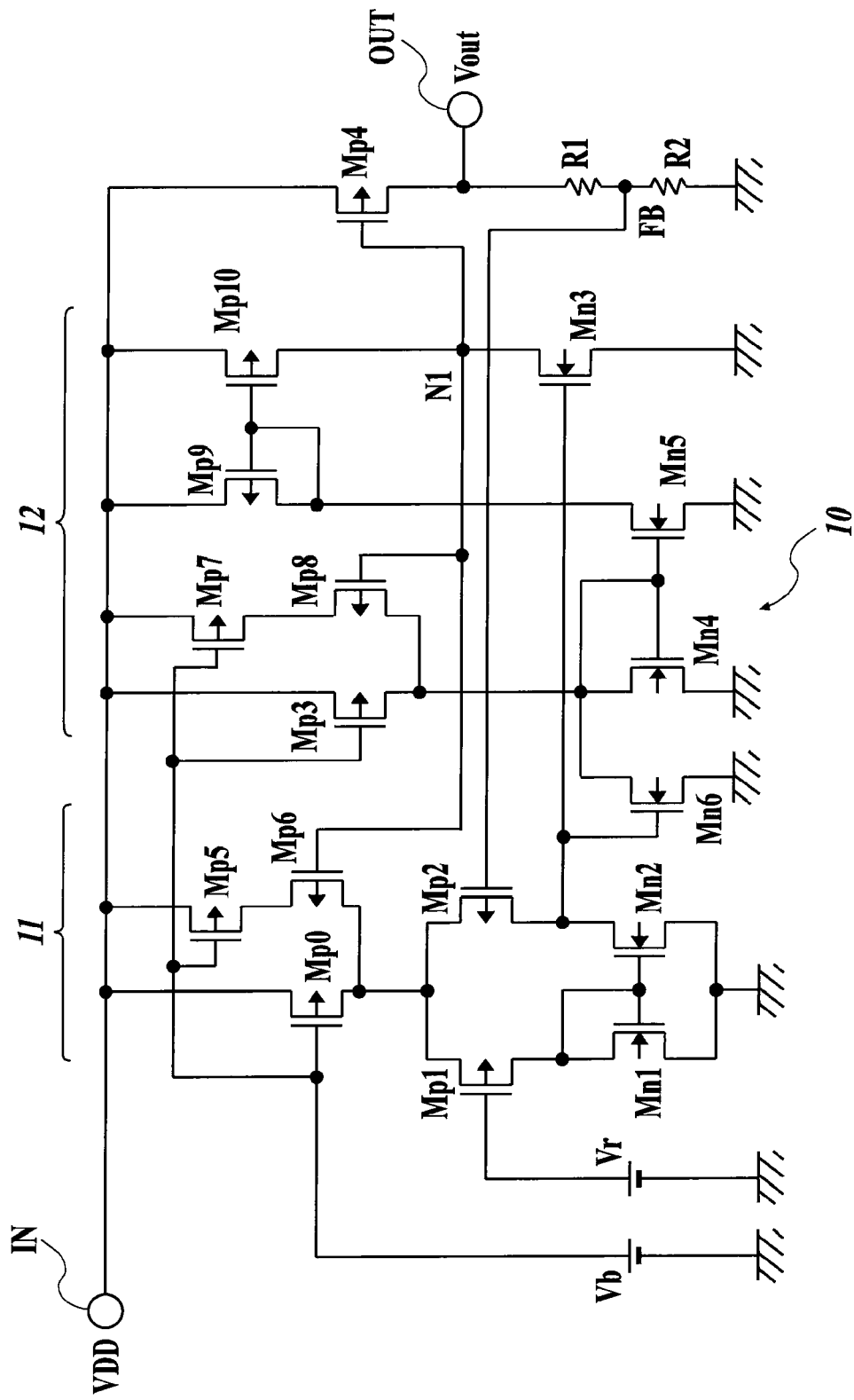
FIG. 2 is a circuit diagram illustrating the second embodiment of the differential amplifier circuit and the series regulator of FIG. 1.

FIG. 2 is a circuit diagram illustrating the second embodiment of the differential amplifier circuit and the series regulator of FIG. 1.

In the second embodiment illustrated in FIG. 2, the constant-current source of the output stage 12 in the differential amplifier circuit of the first embodiment is composed of the constant-current MOS transistor Mp3, a first current mirror circuit, and a second current mirror circuit. The first current mirror circuit includes an N-channel MOS transistor Mn4 (first current-voltage conversion MOS transistor) that is connected in series to the constant-current MOS transistor Mp3, and includes a MOS transistor Mn5 (third MOS transistor), wherein the gate of the MOS transistor Mn5 and the gate of the MOS transistor Mn4 are commonly connected. The second current mirror circuit includes a P-channel MOS transistor Mp9 (second current-voltage conversion MOS transistor) that is connected in series to the MOS transistor Mn5, and includes a MOS transistor Mn10 (fourth MOS transistor), wherein the gate of the MOS transistor Mp10 and the gate of the MOS transistor Mp9 are commonly connected. The constant current that is folded twice by the first and second current mirror circuits flows through the MOS transistor Mn3 of the output stage 12.

In the second embodiment, the MOS transistor Mp5 in which the bias voltage Vb identical to that of the constant-current MOS transistor Mp0 is applied to the gate terminal thereof, and the MOS transistor Mp6 to which the voltage at the connection node N1 of the MOS transistors Mp3 and Mn3 of the output stage 12, are connected in parallel to the constant-current MOS transistor Mp0 of the differential input stage 11. Similarly in the output stage 12, the MOS transistor Mp7 in which the bias voltage Vb identical to that of the constant-current MOS transistor Mp3 is applied to the gate terminal thereof, and the MOS transistor Mp8 to which the voltage at the connection node N1 of the MOS transistors Mp3 and Mn3 of the output stage 12, are connected in parallel to the constant-current MOS transistor Mp3.

In the differential amplifier circuit of the second embodiment, similarly to the differential amplifier circuit of FIG. 1, when a heavy load is connected, the transient response characteristic can be improved by allowing the boost current to flow. On the other hand, when the connected load is light, the boost current is not allowed to flow, so that the consumption current can be reduced. Because the operation of the differential amplifier circuit of the second embodiment is similar to that of the first embodiment illustrated in FIG. 1, the redundant description is not repeated. Additionally, the second embodiment has the advantage that the first and second current mirror circuits can simultaneously increase the operating current and the boost current which flow through the MOS transistor Mn3 of the output stage 12. The differential amplifier circuit of the second embodiment is effectively applied when both the operating current and the boost current of the output stage 12 are to be increased.

In the differential amplifier circuit of the second embodiment as shown in FIG. 2, an N-channel MOS transistor Mn6 (current extracting MOS transistor) is provided in parallel to the MOS transistor Mn4 which constitutes the first current mirror circuit of the output stage 12, wherein the gate of the MOS transistor Mn6 and the gate of the N-channel MOS transistor Mn3, which is on the ground side of the output stage 12, are commonly connected. In the differential amplifier circuit of the first embodiment illustrated in FIG. 1, it is only possible to control whether to allow the boost current of the output stage 12 to flow or not. On the other hand, in the differential amplifier circuit of the second embodiment shown in FIG. 2, it is possible to adjust the current flowing through the current mirror circuit by controlling the MOS transistor Mn6 according to the voltage identical to the gate voltage at the MOS transistor Mn3 and extracting a part of the current from the current mirror circuit. Therefore, the differential amplifier circuit shown in FIG. 2 has the advantage that the boost current can be allowed to flow according to the amount of the load.

The N-channel MOS transistor Mn4 provided in the differential amplifier circuit of the second embodiment can also be applied to the differential amplifier circuit of the first embodiment illustrated in FIG. 1, which produces the similar action and effect.

(Third Embodiment)

Figure 3:
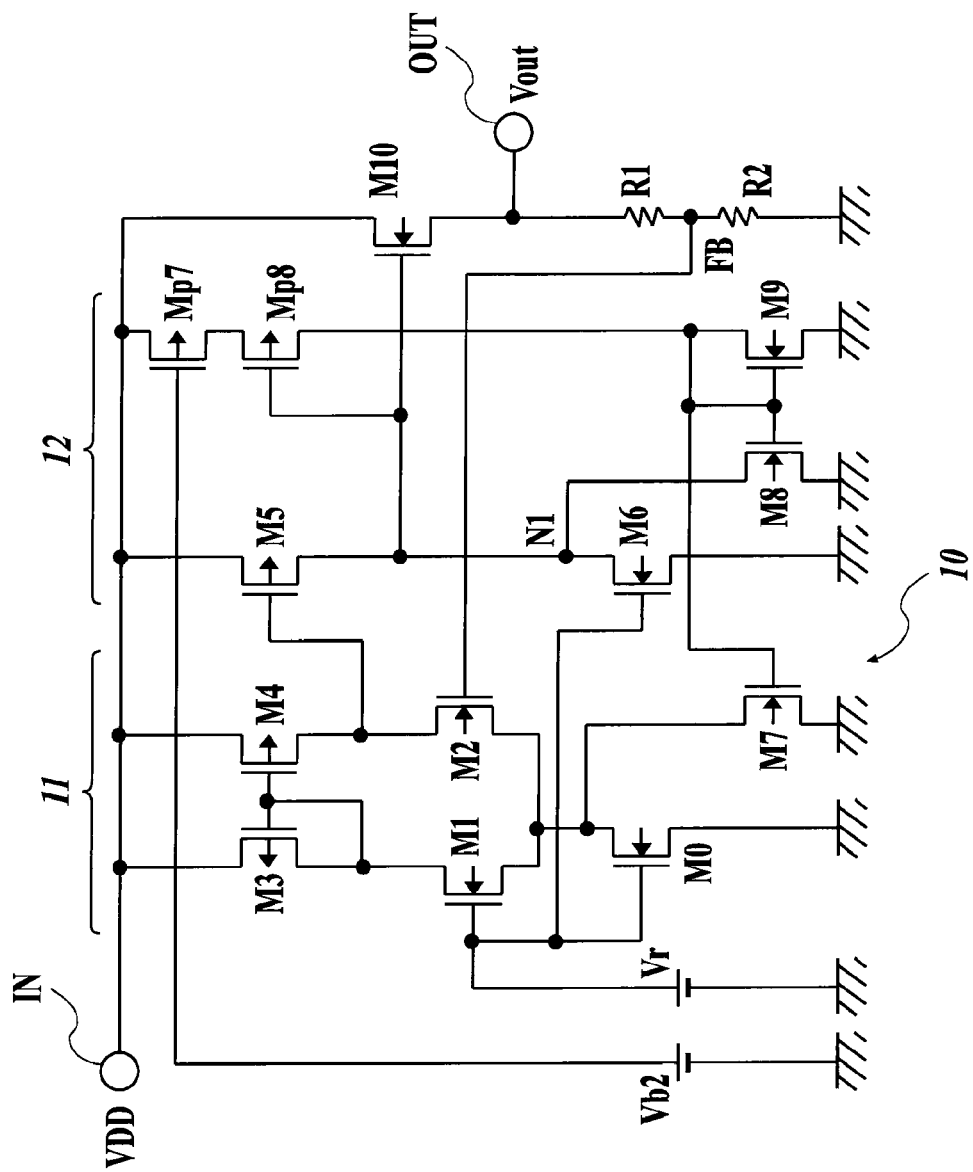
FIG. 3 is a circuit diagram illustrating the third embodiment of the differential amplifier circuit and the series regulator of FIG. 1.
Figure 4:
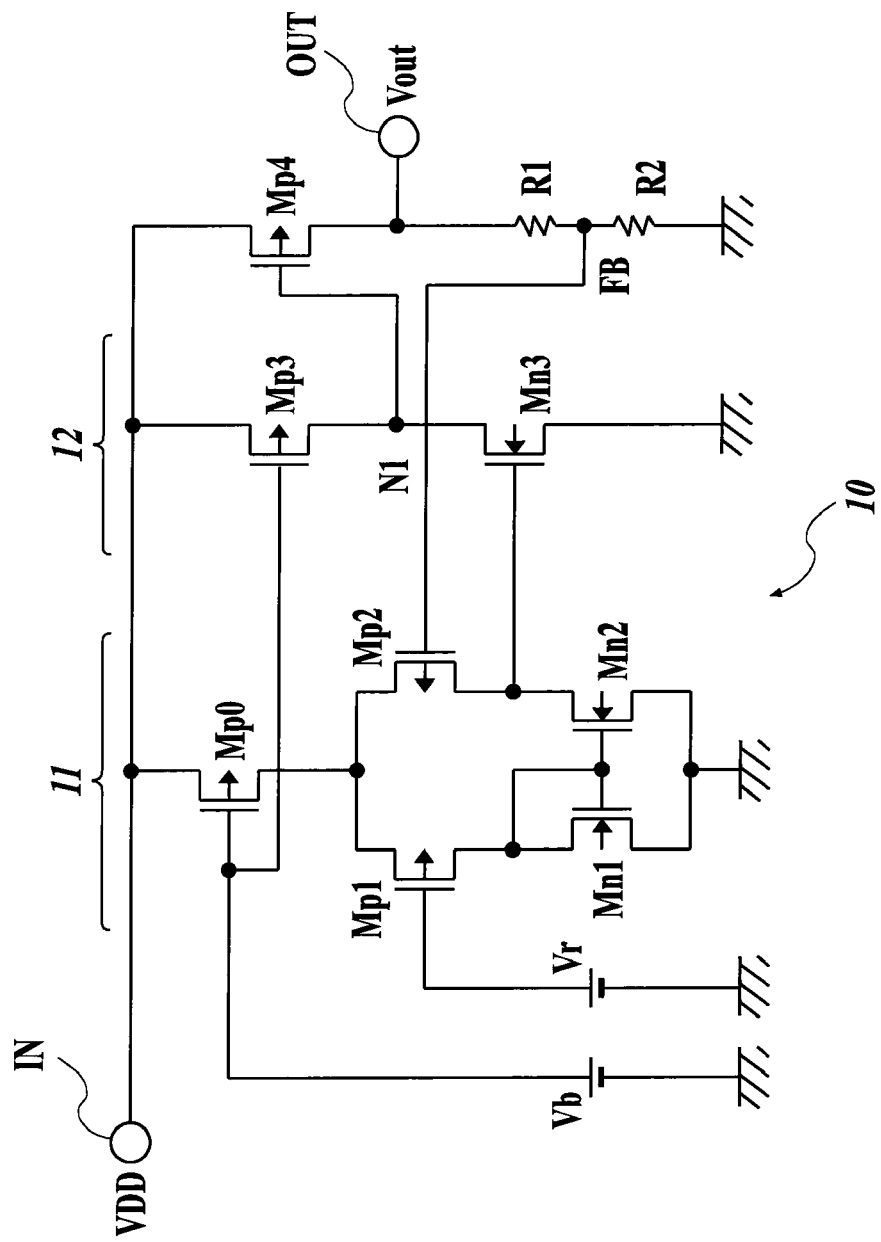
FIG. 4 is a circuit diagram illustrating an embodiment of a conventional voltage controlling differential amplifier circuit and a series regulator which uses the voltage controlling differential amplifier circuit.

FIG. 3 is a circuit diagram illustrating the third embodiment of the differential amplifier circuit and the series regulator of FIG. 1.

The first embodiment illustrated in FIG. 1 is applied to a differential amplifier circuit in which the P-channel MOS transistors are used as the differential MOS transistors Mp1 and Mp2.

On the other hand, the third embodiment illustrated in FIG. 3 is the example where the present invention is applied to the differential amplifier circuit in which the N-channel MOS transistors are used as differential MOS transistors M1 and M2.

In the third embodiment, load MOS transistors M3 and M4 composed of P-channel MOS transistors are connected between the drain terminals of the differential MOS transistors M1 and M2 of the differential input stage 11 and the power supply voltage VDD. A constant-current MOS transistor M0 composed of an N-channel MOS transistor is connected between the common source of the differential MOS transistors M1 and M2 and the ground point. In the output stage 12, a P-channel MOS transistor M5 and an N-channel MOS transistor M6 are connected in series between the power supply voltage VDD and the ground point. The reference voltage Vr that is the constant voltage is applied to the gate terminals of the MOS transistors M0 and M6, and each of the MOS transistors M0 and M6 act as the constant-current sources. The bias voltage (<Vr) whose potential is different from that of the reference voltage Vr may be applied to the gate terminals of the MOS transistors M0 and M6.

The P-channel MOS transistors Mp7 and Mp8 are connected in series between the power supply voltage VDD and the ground point. When a heavy load is connected, a boost current is generated in such a way that the bias voltage Vb2 is applied to the gate of the MOS transistor Mp7, and that the voltage at the connection node N1 of the MOS transistors M5 and M6 is applied to the gate of the MOS transistor Mp8. A MOS transistor M7, a MOS transistor M8, and a MOS transistor M9 are also provided. The MOS transistor M7 is connected in parallel to the constant-current MOS transistor M0 of the differential input stage 11. The MOS transistor M8 is connected in parallel to the constant-current MOS transistor M6 of the output stage 12. In order to allow the boost current to flow through the MOS transistors M7 and M8, the MOS transistor M9 is connected in series to the MOS transistors Mp7 and Mp8, and connected to the MOS transistors M7 and M8 in a current mirror manner. The boost current generated by the MOS transistors Mp7 and Mp8 is allowed to flow through the MOS transistor M7 by the current mirror of the MOS transistors M9 and M7, and the boost current is allowed to flow through the MOS transistor M8 by the current mirror of the MOS transistors M9 and M8.

In the steady state of the differential amplifier circuit of the third embodiment, even if the constant-current MOS transistors M0 and M6 and a control MOS transistor M10 are turned on, the MOS transistor Mp8 is in an off-state. In this state, when the load connected to the output terminal OUT is rapidly increased, an output voltage Vout falls to decrease the feedback voltage FB divided by the resistors R1 and R2. Then, feedback control is performed in the following way; the drain voltage at the differential MOS transistor M2 whose gate terminal receives the feedback voltage rises, and thereby, the current of the MOS transistor M5 of the output stage 12 is decreased. Then, the voltage at the connection node N1 of the MOS transistors M5 and M6 falls, and thereby, the current of the control MOS transistor M10 is increased.

When the voltage at the connection node N1 of the MOS transistors M5 and M6 falls due to the rapid increase of the load, the MOS transistor Mp8 is turned on, and the boost currents are allowed to flow through the MOS transistor M9 and the MOS transistors M7 and M8 each of which is connected to the MOS transistor M9 in a current mirror manner, thereby increasing the currents of the differential input stage 11 and the output stage 12. Therefore, in the differential amplifier circuit of the third embodiment, the transient response characteristic can be improved by allowing the boost current to flow when a heavy load is connected. The boost current is not allowed to flow when the connected load is light, so that the consumption current is reduced.

Although the present invention is specifically described based on the embodiments above, the invention is not limited to the embodiments. For example, a current mirror circuit similar to the first current mirror circuit (the MOS transistors Mn4 and Mn5) and the second current mirror circuit (the MOS transistors Mp9 and Mp10), which are provided in the differential amplifier circuit of FIG. 2, may be added to the differential amplifier circuit of FIG. 3, and a MOS transistor having the function similar to that of the boost current adjusting MOS transistor Mn6 provided in the differential amplifier circuit of FIG. 2 may be provided in the differential amplifier circuit of FIG. 3.

In the embodiments, the MOS transistors allow the boost current to flow through each of the constant-current source of the differential input stage 11 and the constant-current source of the output stage 12. Alternatively, the MOS transistors may allow the boost current to flow through only one of the constant-current source of the differential input stage 11 and the constant-current source of the output stage 12. Further, in the embodiments, the differential amplifier circuit is composed of the MOS transistors. Alternatively, bipolar transistors may be used instead of the MOS transistors.

In the embodiments, the invention is applied to a voltage controlling differential amplifier circuit of a series regulator. However, the invention is not limited to the voltage controlling differential amplifier circuit of the series regulator. The invention may widely be applied to a differential amplifier circuit used in a system where the amount of load is largely changed.

According to a first aspect of the preferred embodiments of the present invention, there is provided a differential amplifier circuit including: a differential input stage including a pair of differential MOS transistors whose sources are commonly connected, a pair of load elements that are connected to drain terminals of the differential MOS transistors, respectively, and a first constant-current source that is connected to the common source of the pair of differential MOS transistors; an output stage including an output MOS transistor whose gate terminal receives a potential of an output node of the differential input stage, and a second constant-current source that is connected in series to the output MOS transistor; a constant-current MOS transistor that is provided in parallel to one of the first constant-current source and the second constant-current source; and a boost current controlling MOS transistor in which a potential of a connection node of the output MOS transistor and the second constant-current source is applied to a gate terminal thereof; wherein the boost current controlling MOS transistor is turned on when a voltage inputted to a gate terminal of one of the pair of differential MOS transistors changes, and a current of the constant-current MOS transistor is added to one of the first constant-current source and the second constant-current source and is allowed to flow through one of the differential input stage and the output stage.

This configuration makes it possible to provide a differential amplifier circuit that can change the current flowing through the constant-current source according to the load variation to enhance the transient response characteristic without increasing the unnecessary current or without largely increasing the circuit scale.

Preferably, one of the first constant-current source and the second constant-current source is composed of a MOS transistor in which a predetermined bias voltage is applied to a gate terminal thereof, the bias voltage is applied to a gate terminal of the constant-current MOS transistor, and the constant-current MOS transistor and the boost current controlling MOS transistor are connected in series.

This configuration makes it possible to provide a differential amplifier circuit that has a good transient response characteristic by adding only a small number of elements.

According to a second aspect of the preferred embodiments of the present invention, there is provided a differential amplifier circuit including: a differential input stage including a pair of differential MOS transistors whose sources are commonly connected, a pair of load elements that are connected to drain terminals of the differential MOS transistors, respectively, and a first constant-current source that is connected to the common source of the pair of differential MOS transistors; an output stage including an output MOS transistor whose gate terminal receives a potential of an output node of the differential input stage, and a second constant-current source that is connected in series to the output MOS transistor; a first constant-current MOS transistor that is provided in parallel to the first constant-current source; a second constant-current MOS transistor that is provided in parallel to the second constant-current source; and a boost current controlling MOS transistor in which a potential of a connection node of the output MOS transistor and the second constant-current source is applied to a gate terminal thereof; wherein the boost current controlling MOS transistor is turned on when a voltage inputted to a gate terminal of one of the pair of differential MOS transistors changes, and currents of the first constant-current MOS transistor and the second constant-current MOS transistor are added to the first constant-current source and the second constant-current source, respectively, and are allowed to flow through the differential input stage and the output stage.

This configuration makes it possible to provide a differential amplifier circuit that can change the currents flowing through the constant-current sources both in the differential input stage and the output stage according to the load variation to enhance the transient response characteristic without increasing the unnecessary current or without largely increasing the circuit scale.

Preferably, each of the first constant-current source and the second constant-current source is composed of a MOS transistor in which a predetermined bias voltage is applied to a gate terminal thereof, the bias voltage is commonly applied to gate terminals of the first constant-current MOS transistor and the second constant-current MOS transistor;

a first boost current controlling MOS transistor is provided corresponding to the first constant-current MOS transistor, and a second boost current controlling MOS transistor is provided corresponding to the second constant-current MOS transistor; and the first constant-current MOS transistor and the first boost current controlling MOS transistor are connected in series, and the second constant-current MOS transistor and the second boost current controlling MOS transistor are connected in series.

This configuration makes it possible to provide a differential amplifier circuit that has a good transient response characteristic by adding only a small number of elements.

Preferably, the differential amplifier circuit further including a current extracting MOS transistor in which a voltage identical to a voltage of the output MOS transistor is applied to agate terminal thereof, wherein the current extracting MOS transistor is connected in series to the second constant-current MOS transistor.

This configuration makes it possible to adjust the amount of boost currents to be added to the first constant-current source and the second constant-current source, and thereby, to provide the transient response characteristic according to the amount of load.

Preferably, the differential amplifier circuit further including: a first current-voltage conversion MOS transistor; a second current-voltage conversion MOS transistor; a third MOS transistor; and a fourth MOS transistor; wherein the first current-voltage conversion MOS transistor is connected in series to the second constant-current MOS transistor; a gate of the first current-voltage conversion MOS transistor and a gate of the third MOS transistor are commonly connected to constitute a first current mirror circuit; the second current-voltage conversion MOS transistor is connected in series to the third MOS transistor; a gate of the second current-voltage conversion MOS transistor and a gate of the fourth MOS transistor are commonly connected to constitute a second current mirror circuit; and a current folded by the first current mirror circuit and the second current mirror circuit is allowed to flow through the output MOS transistor as a drain current.

This configuration makes it possible to effectively increase the operating current and the boost current which are allowed to flow through the output stage.

Preferably, a current MOS transistor and a current-voltage conversion MOS transistor to which a predetermined bias voltage is applied are connected in series to the boost current controlling MOS transistor, and gates of the first constant-current MOS transistor and the second constant-current MOS transistor and the current-voltage conversion MOS transistor are commonly connected to constitute a current mirror circuit.

This configuration makes it possible to provide a differential amplifier circuit that has a good transient response characteristic even when the conductivity type of a MOS transistor which constitutes the differential input stage and the conductivity type of a MOS transistor which constitutes the constant-current source are different from each other.

According to a third aspect of the preferred embodiments of the present invention, there is provided a series regulator including: a control transistor that is connected between a voltage input terminal and an output terminal; and the differential amplifier circuit according the preferred embodiments, wherein a reference voltage is applied to a non-inverting input terminal of the differential input stage, a voltage at the output terminal or a voltage into which the voltage at the output terminal is divided is applied to an inverting input terminal of the differential input stage, and the control transistor is controlled according to a voltage at the output node of the output stage.

This configuration makes it possible to provide a series regulator that has a good transient response characteristic.

The entire disclosure of Japanese Patent Application No. 2010-152568 filed on Jul. 5, 2010 including description, claims, drawings, and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:
1. A differential amplifier circuit comprising:
a differential input stage including a pair of differential MOS transistors whose sources are commonly connected, a pair of load elements that are connected to drain terminals of the differential MOS transistors, respectively, and a first constant-current source that is connected to the common source of the pair of differential MOS transistors;
an output stage including an output MOS transistor whose gate terminal receives a potential of an output node of the differential input stage, and a second constant-current source that is connected in series to the output MOS transistor;
a constant-current MOS transistor that is provided in parallel to one of the first constant-current source and the second constant-current source; and
a boost current controlling MOS transistor in which a potential of a connection node of the output MOS transistor and the second constant-current source is applied to a gate terminal thereof;
wherein the boost current controlling MOS transistor is turned on when a voltage inputted to a gate terminal of one of the pair of differential MOS transistors changes, and a current of the constant-current MOS transistor is added to one of the first constant-current source and the second constant-current source and is allowed to flow through one of the differential input stage and the output stage.

2. The differential amplifier circuit according to claim 1, wherein one of the first constant-current source and the second constant-current source is composed of a MOS transistor in which a predetermined bias voltage is applied to a gate terminal thereof, the bias voltage is applied to a gate terminal of the constant-current MOS transistor, and the constant-current MOS transistor and the boost current controlling MOS transistor are connected in series.

3. A differential amplifier circuit comprising:
a differential input stage including a pair of differential MOS transistors whose sources are commonly connected, a pair of load elements that are connected to drain terminals of the differential MOS transistors, respectively, and a first constant-current source that is connected to the common source of the pair of differential MOS transistors;
an output stage including an output MOS transistor whose gate terminal receives a potential of an output node of the differential input stage, and a second constant-current source that is connected in series to the output MOS transistor;
a first constant-current MOS transistor that is provided in parallel to the first constant-current source;
a second constant-current MOS transistor that is provided in parallel to the second constant-current source; and
a boost current controlling MOS transistor in which a potential of a connection node of the output MOS transistor and the second constant-current source is applied to a gate terminal thereof;
wherein the boost current controlling MOS transistor is turned on when a voltage inputted to a gate terminal of one of the pair of differential MOS transistors changes, and currents of the first constant-current MOS transistor and the second constant-current MOS transistor are added to the first constant-current source and the second constant-current source, respectively, and are allowed to flow through the differential input stage and the output stage.

4. The differential amplifier circuit according to claim 3, wherein:
each of the first constant-current source and the second constant-current source is composed of a MOS transistor in which a predetermined bias voltage is applied to a gate terminal thereof, and the bias voltage is commonly applied to gate terminals of the first constant-current MOS transistor and the second constant-current MOS transistor;
a first boost current controlling MOS transistor is provided corresponding to the first constant-current MOS transistor, and a second boost current controlling MOS transistor is provided corresponding to the second constant-current MOS transistor; and
the first constant-current MOS transistor and the first boost current controlling MOS transistor are connected in series, and the second constant-current MOS transistor and the second boost current controlling MOS transistor are connected in series.

5. The differential amplifier circuit according to claim 4, further comprising a current extracting MOS transistor in which a voltage identical to a voltage of the output MOS transistor is applied to a gate terminal thereof, wherein the current extracting MOS transistor is connected in series to the second constant-current MOS transistor.

6. The differential amplifier circuit according to claim 5, further comprising:
a first current-voltage conversion MOS transistor;
a second current-voltage conversion MOS transistor;
a third MOS transistor; and
a fourth MOS transistor;
wherein the first current-voltage conversion MOS transistor is connected in series to the second constant-current MOS transistor;
a gate of the first current-voltage conversion MOS transistor and a gate of the third MOS transistor are commonly connected to constitute a first current mirror circuit;
the second current-voltage conversion MOS transistor is connected in series to the third MOS transistor;
a gate of the second current-voltage conversion MOS transistor and a gate of the fourth MOS transistor are commonly connected to constitute a second current mirror circuit; and
a current folded by the first current mirror circuit and the second current mirror circuit is allowed to flow through the output MOS transistor as a drain current.

7. The differential amplifier circuit according to claim 3, wherein a current MOS transistor and a current-voltage conversion MOS transistor to which a predetermined bias voltage is applied are connected in series to the boost current controlling MOS transistor, and gates of the first constant-current MOS transistor and the second constant-current MOS transistor and the current-voltage conversion MOS transistor are commonly connected to constitute a current mirror circuit.

8. A series regulator comprising the differential amplifier circuit according to claim 1, and further comprising:
a control transistor that is connected between a voltage input terminal and an output terminal;
wherein a reference voltage is applied to a non-inverting input terminal of the differential input stage, a voltage at the output terminal or a voltage into which the voltage at the output terminal is divided is applied to an inverting input terminal of the differential input stage, and the control transistor is controlled according to a voltage at an output node of the output stage.

9. A series regulator comprising the differential amplifier circuit according to claim 2, and further comprising:
a control transistor that is connected between a voltage input terminal and an output terminal;
wherein a reference voltage is applied to a non-inverting input terminal of the differential input stage, a voltage at the output terminal or a voltage into which the voltage at the output terminal is divided is applied to an inverting input terminal of the differential input stage, and the control transistor is controlled according to a voltage at an output node of the output stage.

10. A series regulator comprising the differential amplifier circuit according to claim 3, and further comprising:
   a control transistor that is connected between a voltage input terminal and an output terminal;
   wherein a reference voltage is applied to a non-inverting input terminal of the differential input stage, a voltage at the output terminal or a voltage into which the voltage at the output terminal is divided is applied to an inverting input terminal of the differential input stage, and the control transistor is controlled according to a voltage at an output node of the output stage.

11. A series regulator comprising the differential amplifier circuit according to claim 4, and further comprising:
   a control transistor that is connected between a voltage input terminal and an output terminal;
   wherein a reference voltage is applied to a non-inverting input terminal of the differential input stage, a voltage at the output terminal or a voltage into which the voltage at the output terminal is divided is applied to an inverting input terminal of the differential input stage, and the control transistor is controlled according to a voltage at an output node of the output stage.

12. A series regulator comprising the differential amplifier circuit according to claim 5, and further comprising:
   a control transistor that is connected between a voltage input terminal and an output terminal;
   wherein a reference voltage is applied to a non-inverting input terminal of the differential input stage, a voltage at the output terminal or a voltage into which the voltage at the output terminal is divided is applied to an inverting input terminal of the differential input stage, and the control transistor is controlled according to a voltage at an output node of the output stage.

13. A series regulator comprising the differential amplifier circuit according to claim 6, and further comprising:
   a control transistor that is connected between a voltage input terminal and an output terminal;
   wherein a reference voltage is applied to a non-inverting input terminal of the differential input stage, a voltage at the output terminal or a voltage into which the voltage at the output terminal is divided is applied to an inverting input terminal of the differential input stage, and the control transistor is controlled according to a voltage at an output node of the output stage.

14. A series regulator comprising the differential amplifier circuit according to claim 7, and further comprising:
   a control transistor that is connected between a voltage input terminal and an output terminal; and
   wherein a reference voltage is applied to a non-inverting input terminal of the differential input stage, a voltage at the output terminal or a voltage into which the voltage at the output terminal is divided is applied to an inverting input terminal of the differential input stage, and the control transistor is controlled according to a voltage at an output node of the output stage.

* * * * *